United States Patent
Park

[19]

[11] Patent Number: 5,828,314
[45] Date of Patent: Oct. 27, 1998

[54] PAGER WITH ADAPTABLE ALARM

[75] Inventor: Michael C. Park, Portland, Oreg.

[73] Assignee: Seiko Communication Systems, Beaverton, Oreg.

[21] Appl. No.: 732,174

[22] Filed: Oct. 16, 1996

[51] Int. Cl.⁶ .................................................. G08B 5/22
[52] U.S. Cl. ..................................... 340/825.44; 367/197
[58] Field of Search ........................ 340/825.44, 825.45, 340/311.1; 367/197, 198, 199; 381/107, 108

[56] References Cited

U.S. PATENT DOCUMENTS

| | | | |
|---|---|---|---|
| 4,237,448 | 12/1980 | Weinberg | 340/311.1 |
| 4,438,527 | 3/1984 | Hammond | 381/107 |
| 4,904,992 | 2/1990 | Grothause | 340/825.44 |
| 4,918,438 | 4/1990 | Yamasaki | 340/825.44 |
| 5,077,799 | 12/1991 | Cotton | 381/107 |
| 5,093,658 | 3/1992 | Grothause | 340/311.1 |
| 5,189,389 | 2/1993 | De Luca et al. | 340/311.1 |
| 5,596,651 | 1/1997 | Yamaguchi | 381/107 |
| 5,646,589 | 7/1997 | Murray et al. | 340/825.44 |

*Primary Examiner*—Brian Zimmerman
*Assistant Examiner*—Edward Merz
*Attorney, Agent, or Firm*—Elmer Galbi

[57] ABSTRACT

A paging device references current ambient sound energy in selecting alarm presentation. In the illustrated embodiment, a low volume alarm presentation occurs in relatively quiet ambient sound conditions and a high volume alarm presentation occurs in relatively loud ambient sound conditions. Multiple levels of ambient sound energy cause a selected one of multiple potential alarm volumes. By making alarm volume presentation a function of ambient sound conditions, the paging alarm of the present invention better matches current conditions to improve the user's ability to hear the alarm and to reduce the risk of annoying others.

1 Claim, 6 Drawing Sheets

PAGER WITH ADAPTABLE ALARM

RELATED APPLICATIONS

This application is related to application Ser. No. 08/037,769 filed Mar. 26, 1993 which is abandoned (P106) and application Ser. No. 08/324,850 filed Oct. 14, 1994 which is now pending (P106 FWC).

FIELD OF THE INVENTION

The present invention relates generally to portable personal electronic devices, and particularly to paging devices with audible alarm presentation.

BACKGROUND OF THE INVENTION

Paging devices typically include an alarm notifying the user when a message has been received and is available for display. The user responds to the alarm by reviewing the message and, if necessary, promptly responding to the message. In this aspect, the paging device alarm serves a potentially vital purpose in promptly notifying the user of urgent paging messages. Most paging device users prefer to be notified immediately regarding paging message receipt.

Paging devices are typically worn throughout the day and taken into various environments, e.g., a church, a museum, or a meeting. In many such environments a loud paging alarm is considered offensive or at least a nuisance. Most paging devices allow the user to disable all alarms and thereby silence the paging device completely to avoid disruption of others. The user must frequently remember, however, to look at or interact with the paging device to be aware of incoming messages. Some paging devices selectively inhibit the alarm as a function of certain message types or content. For example, weather information or stock information messages arrive unannounced, i.e., no alarm. Some paging devices use a vibrating device to silently notify the user of message receipt. Such vibrating alarms require significant energy and dimensions, i.e., a large battery and space for the vibrating device. Accordingly, vibrating alarms are not feasible in highly compact, battery-efficient paging devices. Some paging devices begin alarm presentation at a low volume and ramp the volume upward according to a predetermined escalation. The user has opportunity to terminate alarm presentation, e.g., press a paging device button, upon first hearing the increasing volume paging alarm. In many cases, however, the user does not stop alarm presentation until the volume is significant and annoying. Other paging systems allow the user to set a paging alarm tone, beep pattern, or volume. The user must manually set the new alarm tone, beep pattern, or volume each time a new setting is desired or necessary.

Because paging devices are carried through a variety of ambient conditions and because paging messages tend to arrive asynchronously, i.e., one never knows when a paging message will arrive, the user faces a dilemma of either leaving the alarm enabled and possibly annoying others or disabling the alarm completely and possibly missing immediate notification of paging message arrival.

The user wishing to be notified of incoming messages upon arrival, however, generally leaves the alarm enabled and faces the risk of annoying others. The subject matter of the present invention provides a paging alarm notifying the user immediately upon message arrival but reduces the risk of annoying others.

In addition to the risk of annoying others, paging device alarms may not be heard at all in sufficiently loud environments. For example, while driving in a car with the window open, a paging device user often does not hear the paging device alarm.

Thus, a paging device user traveling through a variety of sound environment conditions either may or may not hear the paging alarm, or may offend others with a relatively loud alarm noise at inappropriate times.

The subject matter of the present invention provides paging alarm presentation with reliable user notification, i.e., the user is likely to hear the alarm presentation, without risking an excessively loud or offensive alarm presentation at inappropriate times.

SUMMARY OF THE INVENTION

The present invention provides adaptation in presentation of a pager alarm as a function of ambient conditions. For example, relatively loud ambient conditions cause the pager to adapt alarm volume relatively higher while relatively quit ambient conditions cause the pager to adapt alarm volume relatively lower. Alarm presentation under the present invention better matches current ambient conditions automatically without user manipulation.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE PREFERRED EMBODIMENT

Figure 1:
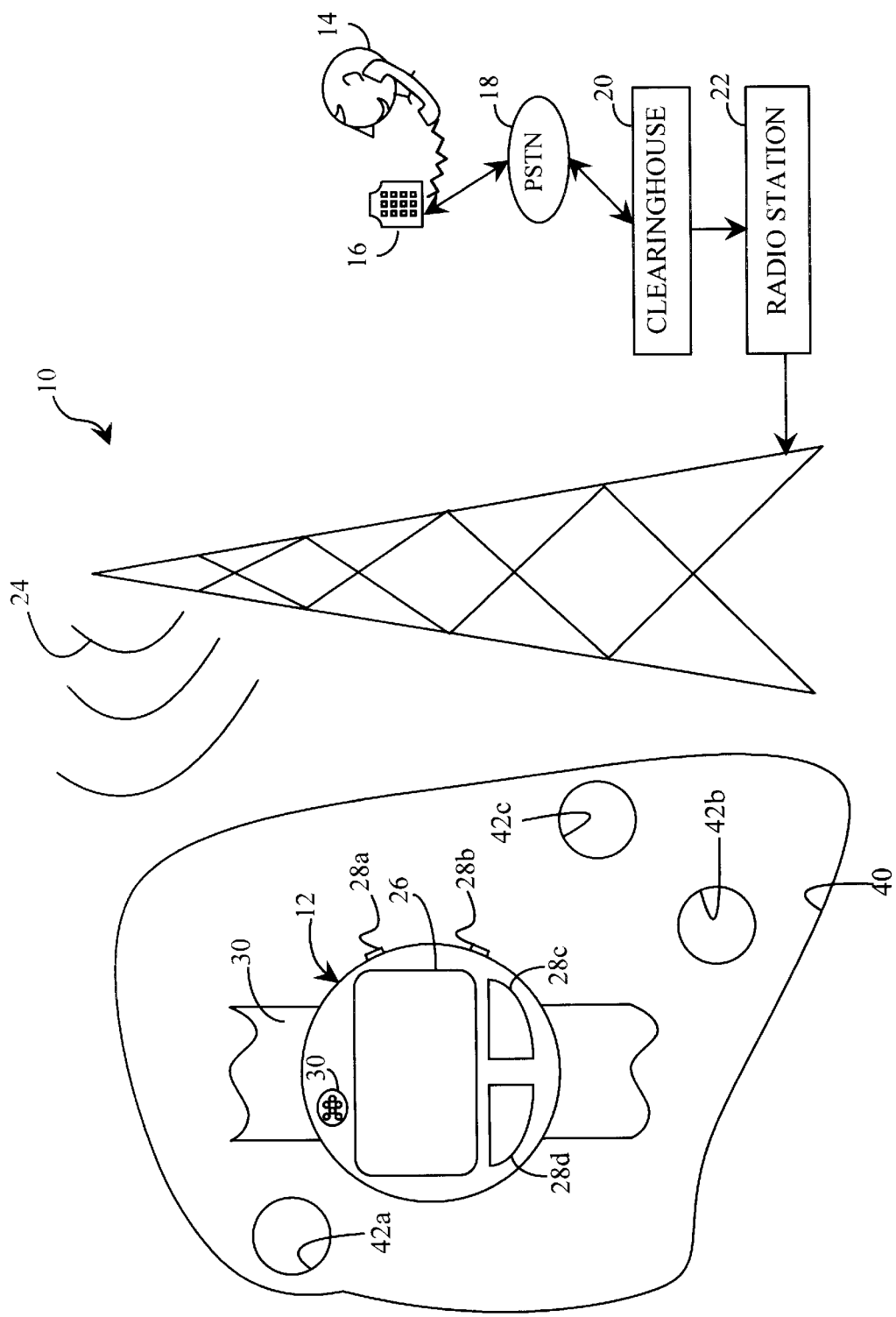
FIG. 1 illustrates a paging system including paging devices with adaptive alarm presentation according to a preferred form of the present invention.

FIG. 1 illustrates a paging system 10 including a population of paging devices 12, only one such paging device 12 being illustrated in FIG. 1. Paging system 10 receives paging information from callers 14 interacting by telephones 16 through a public switch telephone network (PSTN) 18 with a clearinghouse 20. Clearinghouse 20 collects paging information from a variety of sources, e.g., callers 14, and submits such paging information to radio stations 22, only one such radio station 22 being shown in FIG. 1. In addition to callers 14, paging system 10 collects paging information from other sources (not shown) such as stock information, weather information, sports information, and the like.

Paging devices 12, in the illustrated embodiment, take the form of a wristwatch and the wristband constitutes an antenna 30. Each paging device 12 includes an LCD display 26 for presentation of paging messages and includes buttons 28, individually 28a–28d, for user manipulation of the paging device 12. Also, each paging device 12 includes a sound transducer producing an alarm upon message reception.

Thus, paging system 10 transmits in radio signal 24 a variety of paging messages to the population of paging devices 12. Furthermore, paging messages transmitted to paging devices 12 generally arrive asynchronously, i.e., at unknown times, and users generally want immediate notification of paging message receipt.

Each paging device 12 sounds an alarm at transducer 30 when it receives a paging message. As a personal communication device, especially one in wristwatch form, paging device 12 travels through a variety of ambient sound conditions and reacts to such ambient conditions by adaptation in the volume of its alarm presentation. FIG. 1 illustrates schematically placement of a paging device 12 within an ambient environment 40. Ambient environment 40 represents a variety of potential locations for paging device 12 ranging widely in ambient sound conditions. For example, ambient environment 40 may be a church, where the noise level is exceptionally low, or a factory floor where the noise level is exceptionally high.

Ambient environment 40 includes a plurality of noise sources 42, individually 42a–42c, establishing a given noise level within ambient environment 40. Any given ambient environment 40 may contain none or some plurality of discreet noise sources 42, and any given noise source 42 may or may not be producing sound energy. In any event, a given ambient environment 40 will possess at a given time a given magnitude of ambient noise or sound energy.

Figure 2:
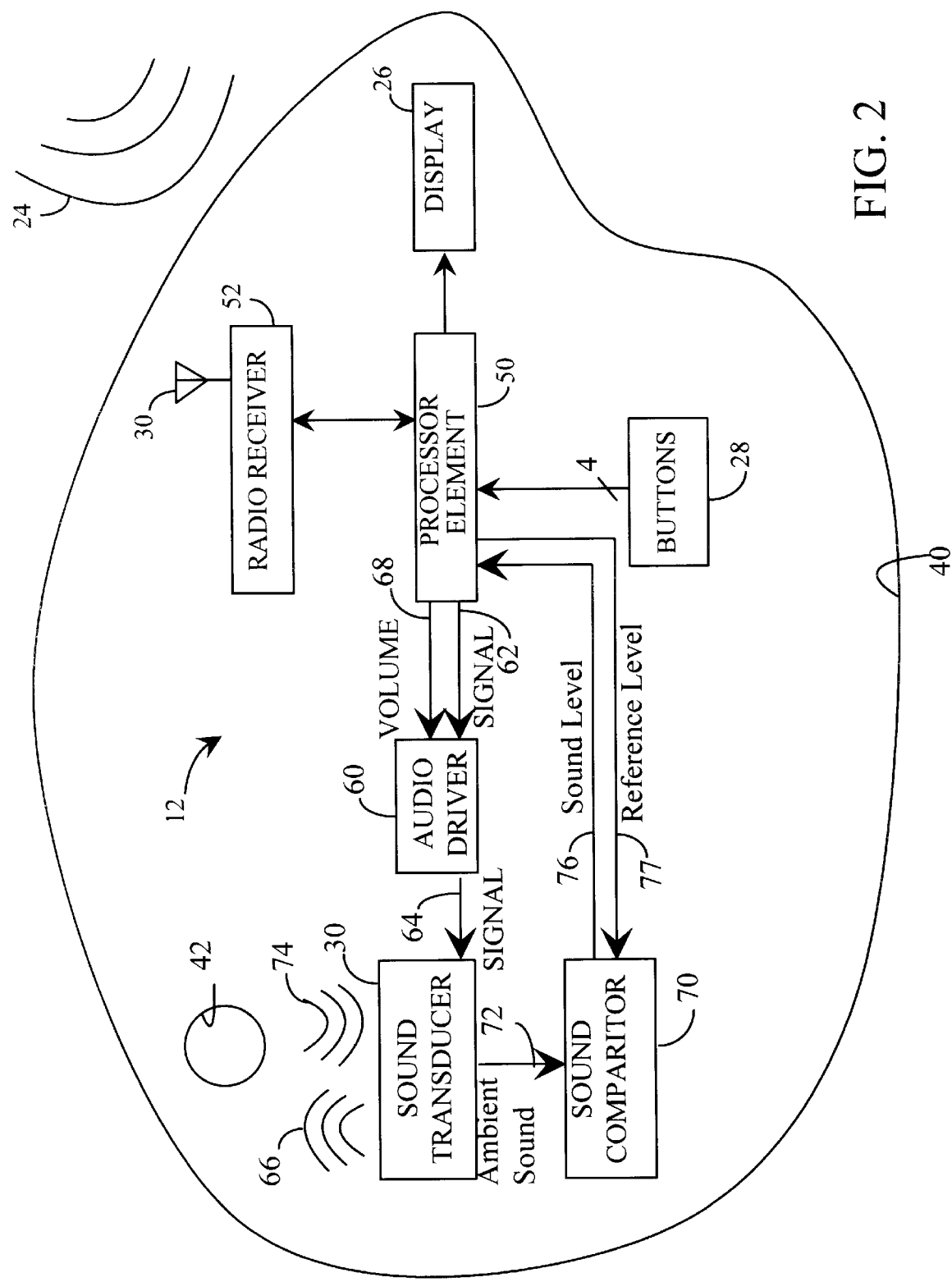
FIG. 2 illustrates in block diagram a paging device of the paging system of FIG. 1.

FIG. 2 illustrates in block diagram the paging device 12 of FIG. 1 within ambient environment 40. In FIG. 2, a processor element 50 orchestrates generally operation of paging device 12. Processor 50 drives LCD display 26 for presentation of various information, e.g., paging information. A radio receiver 52 couples to antenna 30 and receives radio signal 24. Processor element 50 interacts with radio receiver 52 to receive and store paging information obtained from radio signal 24. Processor element 50 monitors buttons 28 to detect and decode user manipulation of paging device 12.

Paging device 12 further includes an audio driver block 60 intermediate processor element 50 and sound transducer 30. As may be appreciated, processor element 50 applies signal 62 to audio driver 60, which in turn directly drives with signal 64 sound transducer 30 to produce audible alarm 66. As may be appreciated, signal 62 may simply trigger generation of signal 64 by audio driver 60, or audio driver 60 may simply amplify signal 62 for application as signal 64 to sound transducer 30.

Processor element 50 issues a volume signal 68 to audio driver 60 dictating the magnitude of sound energy produced, i.e., the volume of alarm 66. Thus, processor element 50 selectively produces alarm 66 and selectively sets a volume for alarm 66 presentation.

Paging device 12 also includes a sound comparitor block 70 receiving from sound transducer 30 an ambient sound signal 72. Sound transducer 30 produces ambient sound signal 72 in response to ambient sound energy 74, e.g., as produced by one or several sound sources 42 within ambient environment 40. Thus, sound comparitor 70 receives signal 72 as a representation of ambient sound energy 74 and produces for delivery to processor element 50 a sound level signal 76. Sound level signal 76 may be identical to ambient sound signal 72, or may be processed to some degree by sound comparitor 70 as described more fully hereafter. For example, processor element 50 provides a reference level signal 77 to sound comparitor 70 and the sound level signal 76 provided in response indicates the magnitude of ambient sound energy 74 relative to reference level signal 77. In this particular example, sound level signal 76 may be a binary signal provided as the result of a simple magnitude comparison.

In operation, processor element 50 monitors sound level signal 76 just prior to alarm presentation and selects a value for volume signal 68. In this manner, the volume of audible alarm 66 is a function of the ambient sound energy 74. For relatively louder ambient sound energy 74, audible alarm 66 is relatively louder. For more quiet ambient sound energy 74, audible alarm 66 is more quiet.

Figure 3A:
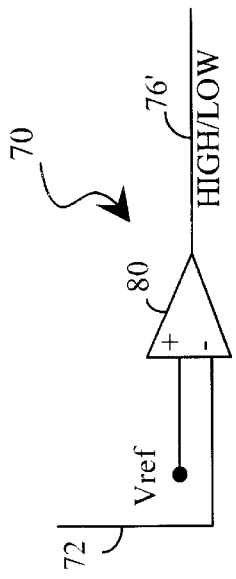
FIGS. 3A–3C illustrate alternative forms of the paging device of FIG. 2, each with an ability to measure and provide representation of ambient sound conditions.
Figure 3B:
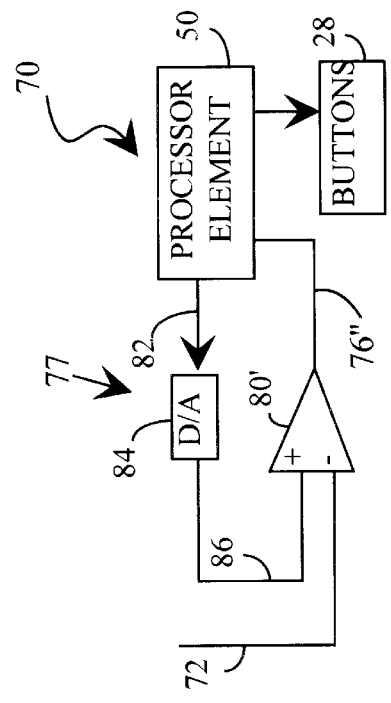
Figure 3C:
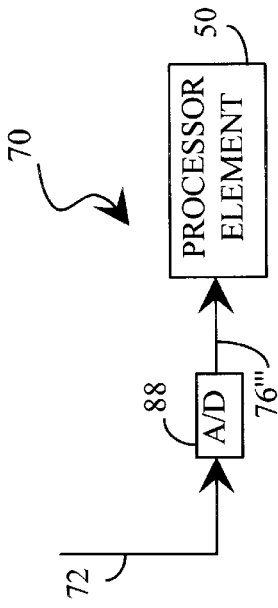

FIGS. 3A–3C illustrate several methods by which processor element 50 measures ambient sound energy. In FIG. 3A, the ambient sound signal 72, i.e., as provided in analog form by sound transducer 30, applies to one input of a comparitor 80. The second input of comparitor 80 receives a fixed voltage (Vref). The output of comparitor 80 thereby provides a binary sound level signal 76 to processor element 50. Under this relatively less expensive configuration, processor element 50 makes a determination as to high or low ambient noise conditions relative to a fixed threshold therebetween. In response, processor element 50 selects a high or a low volume signal 68 for application for audio driver 60.

In FIG. 3B, ambient sound signal 72, as provided in analog form, applies to a first input of a comparitor 80'. Processor element 50 provides (corresponding to reference signal 77 of FIG. 2) a test signal 82 to a digital-to-analog (D/A) block 84. The converted, i.e., analog, form of test signal 82 is applied as signal 86 to the other input of comparitor 80'. Processor element 50 thereby selects a reference voltage for comparison to ambient sound signal 72. By successively providing one or more values for test signal 82 and reading the corresponding sound level signal 76" in binary form, processor element 50 determines a range of sound energy magnitude for ambient sound energy 74. The more iterations of providing a test signal 82 and reading the sound level signal 76", the more closely processor element 50 determines the actual magnitude of ambient sound energy 74. As may be appreciated, however, processor element 50 need not measure precisely a given ambient sound energy 74, but rather only measure sufficiently to select alarm presentation, i.e., to select a value for volume signal 68 as applied to audio driver 60.

In FIG. 3C, processor element 50 receives as the sound level signal 76''' the digital form of sound signal 72 as converted by analog-to-digital (A/D) block 88. In this configuration, processor element 50 reads a magnitude value representing ambient sound energy 74. Comparison to a reference threshold can then occur within processor element 50.

In each of FIGS. 3A–3C, processor element 50 makes some determination, i.e., measurement, of ambient sound energy 74. Based on a representation of ambient sound energy 74, processor element 50 selects a value for the volume signal 68 applied to audio driver 60. Measurement of ambient sound energy 74 may be discreet and limited, i.e., limited to a high/low determination, or may be more precise providing a magnitude of or a narrow range of magnitude containing ambient sound energy 74. In any event, processor element 50 measures ambient sound conditions and selects alarm presentation as a function thereof.

Figure 4:
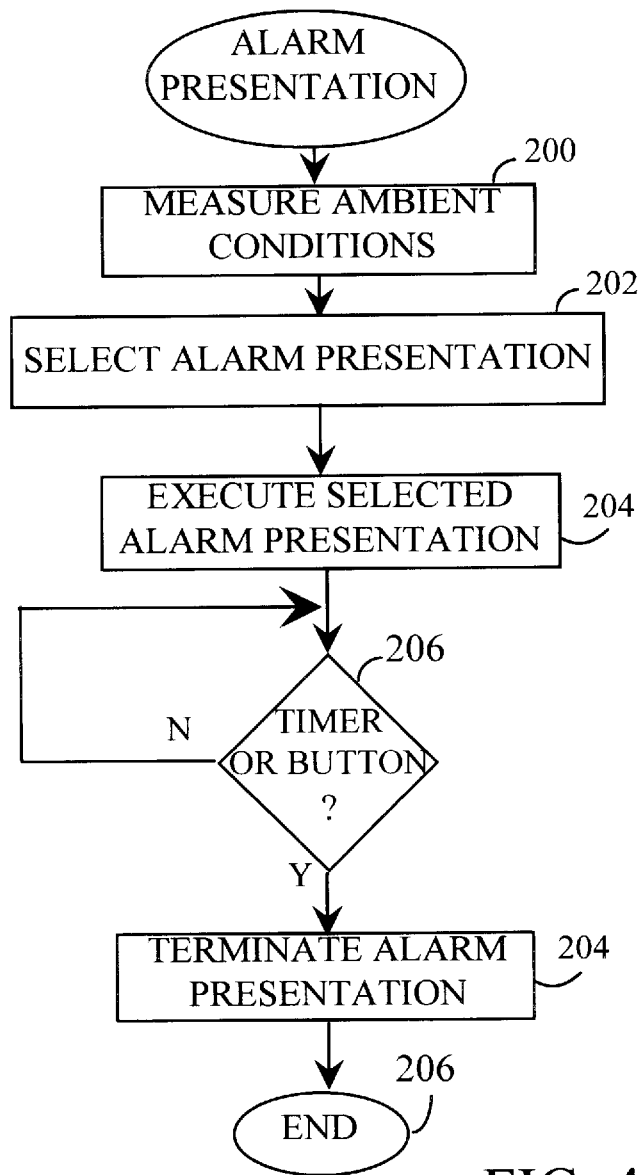
FIG. 4 illustrates by flow chart an adaptive alarm presentation procedure for a processor element of the paging device of FIG. 2.

FIG. 4 illustrates generally programming for processor element 50 in implementation of the preferred form of the present invention. As may be appreciated, programming for paging device 12 includes processor element 50 procedures invoked when triggering alarm presentation, i.e., triggered when a paging message is received. The flow chart of FIG. 4 represents such programming as modified to implement the present invention.

In FIG. 4, alarm presentation begins in block 200 where processor element 50 measures ambient conditions, e.g., by one of the methods illustrated in FIGS. 3A–3C. Given a representation, e.g., high or low or an actual magnitude, of ambient sound conditions, processor element 50 proceeds to block 202 where it selects an alarm presentation. In the illustrated example, processor element 50 selects a value for volume signal 68. Continuing to block 204, processor element 50 executes the selected alarm presentation, i.e., applies signal 62 to audio driver 60 whereby sound transducer 30 produces audible alarm 66 at a volume corresponding to the selected value for volume signal 68. In decision block 206, processor element 50 checks a timer or counter representing the duration of alarm presentation and checks the condition, i.e., user activation, of button 28. If the timer or counter has expired or if the user has activated an appropriate one of buttons 28, processing then branches to block 204 where processor element 50 terminates alarm presentation. Otherwise, alarm presentation programming loops at decision block 206.

The programming of FIG. 4 shows generally the detection or measurement of ambient sound conditions and selection of or adaptation in alarm presentation. Depending on the capabilities of the particular paging device 12, i.e., an ability to detect high versus low ambient sound energy or an ability to measure an actual magnitude of ambient sound energy, programming details of FIG. 4 will vary. For example, the block 202 may simply be a selection between a high or low alarm volume. Alternatively, block 202 may represent application of an ambient sound energy magnitude value to a function producing a value for volume signal 68 as applied to audio driver 60. Similarly, block 200 may involve multiple iterations of providing a reference signal 77 and reading signal 76 to identify a range of ambient sound energy containing the current magnitude of ambient sound energy 74. Finally, measuring ambient sound energy 74 in block 200 should occur over a time interval, e.g., one second, to avoid inaccuracy due to brief large variations in ambient sound energy 74. In any event, paging device 12 measures ambient sound conditions and adapts alarm presentation as a function of current ambient sound conditions.

Figure 5:
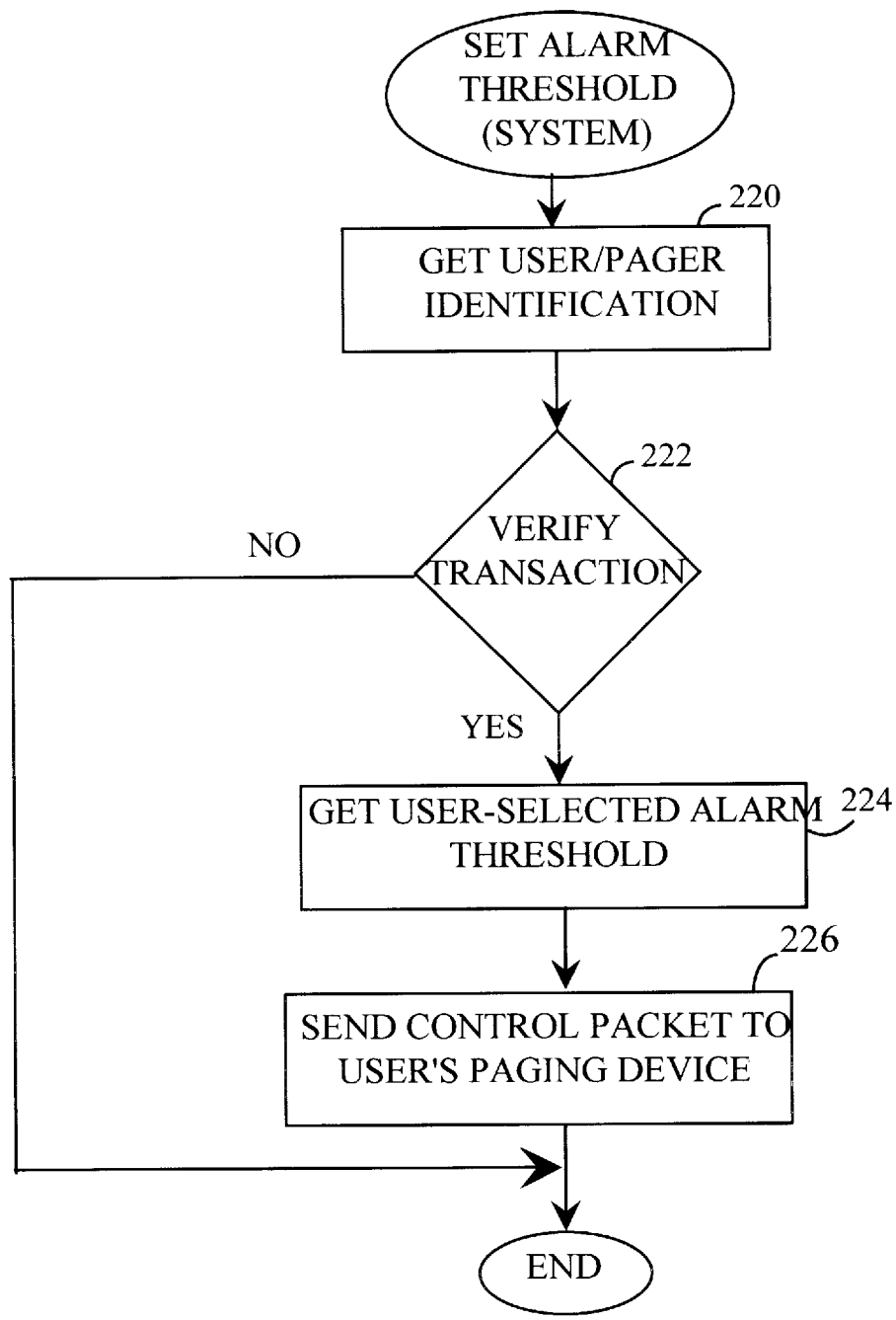
FIG. 5 illustrates paging system programming to establish a user-selected threshold for ambient sound conditions.

FIG. 5 illustrates programming for clearing house 20 (FIG. 1) supporting user-selected ambient sound thresholds to dictate paging device 12 alarm presentation. Generally, the user specifies a threshold for alarm presentation and clearinghouse 20 remotely programs the paging device the react to the new ambient sound level threshold.

In FIG. 5, block 220 illustrates interaction between a user of a paging device 12 and clearinghouse 20 (FIG. 1) which may be conducted by telephone, e.g., via operator or voice response unit, or computer-link, e.g., via Internet page or direct computer exchange. In any case, the user provides to clearinghouse 20 identification of himself or herself as a user, e.g. a user number, and identification of his or her paging device 12, i.e., a paging device serial number. Also, the user should be required to provide a password to authorize modification to paging device 12 operation. In decision block 222, clearing house 20 verifies the transaction, i.e., verifies the user number, paging device serial number, and password, and terminates if the user has provided incorrect identifications or password.

Continuing to block 224, the user provides a new alarm threshold for his or her paging device 12, e.g., an ambient noise level at which paging device 12 switches from a low volume alarm to a high volume alarm. In the present illustration, paging device 12 operates relative to a single ambient sound level threshold, presenting a loud volume alarm 66 when ambient conditions are above the threshold and presenting a low volume alarm 66 when ambient conditions are below the threshold. Accordingly, the user need only specify a single threshold in block 224. For example, the user could select from several predetermined thresholds characterized such as quiet, normal, or loud. In any case, the user responds to some characterization of the available thresholds and selects a threshold.

If paging device 12 permits multiple ambient sound level thresholds for corresponding multiple alarm 66 volume presentations, then each threshold of a set of threshold values would be obtained from the user in block 224. For example, if paging device 12 offers a selection between low, intermediate, and high volume paging alarms then the user would be provided opportunity to select two thresholds, i.e., one separating low and intermediate volume alarm presentation and one separating intermediate and high volume alarm presentation.

In block 226, clearinghouse 20 sends to the specified paging device 12 a control packet, i.e., a special configuration message, causing the paging device 12 to accept a new threshold value, or values, dictating selection of alarm presentation. Under the illustrated example, paging device 12 thereafter selects a high volume alarm 66 when ambient conditions are above the new threshold and selects a low volume alarm 66 when ambient conditions are below the new threshold.

Figure 6A:
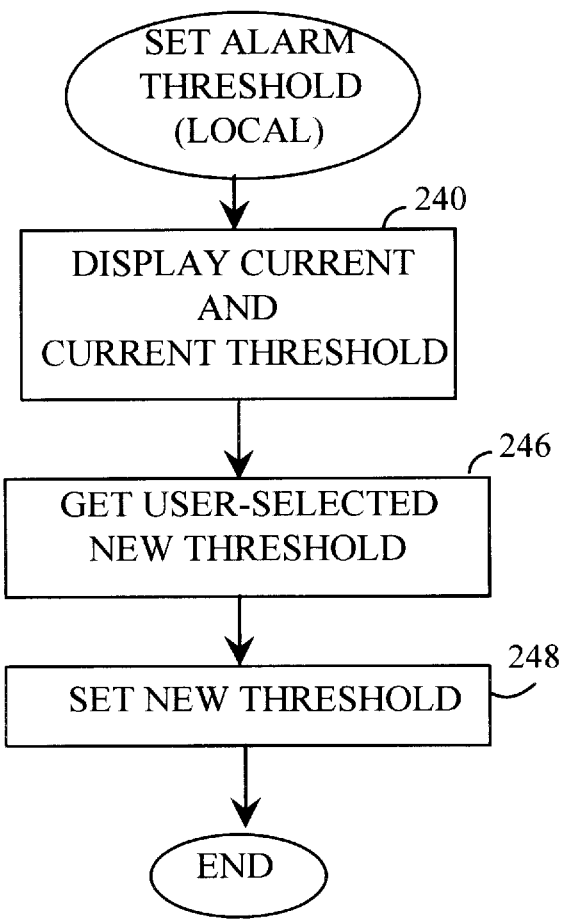
FIGS. 6A and 6B illustrate paging device programming to establish a user-selected threshold for ambient sound conditions.
Figure 6B:
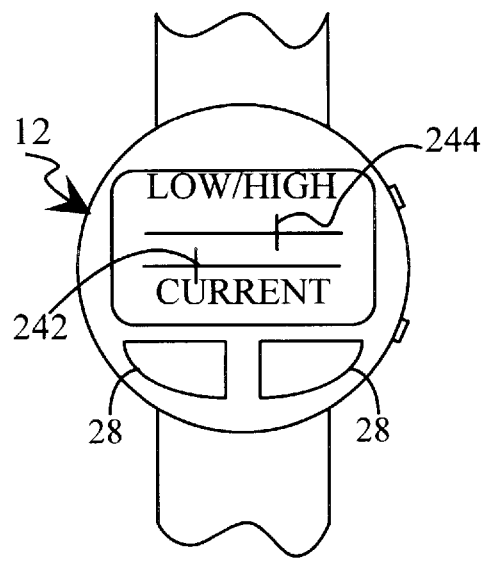

FIG. 6A (flow chart for device 12 programming) and FIG. 6B (device 12 display) illustrate user selection of an ambient sound level threshold by directly manipulating the paging device 12. In FIGS. 6A and 6B, the user enters a "set alarm threshold mode" and in block 240 paging device 12 presents on LCD display 26 a current sound level value 242 and a current threshold level value 244. Current sound level value 242 represents ambient sound energy 74 (FIG. 2) and may be a binary representation, e.g., high or low, or may represent a higher resolution measurement, e.g., a magnitude of sound energy 74, according to the capabilities of the particular paging device 12. Value 242 may not always be used by the user in selecting a new threshold, but could be used when setting a threshold in an ambient environment 40 of concern. For example the user goes to an ambient environment of interest, e.g., in a relatively quiet meeting, and references value 242 when selecting a new threshold level.

The user selects a new threshold value 244 in block 246, e.g., manipulates buttons 28c and 28d to move threshold value 244 on display 26. In block 248, the user has indicated, e.g., by manipulation of buttons 28, that the displayed new value 244 is the new user-selected ambient sound level threshold. Paging device 12 now uses that value, e.g. in block 202 of FIG. 4, to select alarm presentation. As may be appreciated, if multiple threshold levels and corresponding multiple alarm volume settings are available under a particular paging device 12, then the programming of FIG. 6A should allow the user to establish such additional thresholds. For example, if the paging device 12 has three alarm volume settings, i.e., high, middle and low, then programming similar to FIG. 6A is executed to define boundaries between each available volume setting.

The present invention has been illustrated with reference to a "transducer 30" as shown by block diagram in FIG. 2. Many sound producing devices, e.g., speakers, also react to ambient sound energy and serve as a microphone. If paging device 12 includes an acceptable sound transducer, i.e., one capable of both producing alarm 66 and measuring ambient sound energy 74, then a single device may be used to serve both as the alarm generating device and the sound measuring device. If an acceptable single device cannot be used as both a "speaker" and a "microphone" as the transducer 30, then separate speaker and microphone devices may be provided as the transducer 30, i.e., to provide the capability of both producing sound and measuring sound energy.

While the present invention has been shown and illustrated using adaptation in alarm volume as a function of ambient conditions, adaptation in other alarm characteristics as a function of ambient conditions may be performed. For example, in addition to volume control the paging device may adapt alarm tone as a function of detected ambient conditions. For example, a given tone may be better heard at a given volume or under given ambient sound conditions.

The present invention may be used with and combined with the invention shown in application Ser. No. 08/037,769 and application Ser. No. 08/324,850.

It will be appreciated that the present invention is not restricted to the particular embodiment that has been described and illustrated, and that variations may be made therein without departing from the scope of the invention as found in the appended claims and equivalents thereof.

What is claimed is:

1. In a paging device, an improvement comprising:

a sound measurement device providing a representation of ambient sound;

an alarm providing an audible alarm, said alarm having at least a first and a second selectable alarm presentations;

means for storing a reference threshold, said reference threshold being selected by a user of said paging device; and control circuitry receiving said representation of ambient sound and selectively driving said alarm to cause one of said first and said second selectable alarm presentations as a function of a comparison of said representation of ambient sound and said reference threshold.

* * * * *